United States Patent
Liedenbaum et al.

(10) Patent No.: US 7,180,239 B2
(45) Date of Patent: Feb. 20, 2007

(54) DISPLAY DEVICE WITH OPENINGS IN AN INSULATING STRUCTURE

(75) Inventors: Coen Theodorus Hubertus Fransiscus Liedenbaum, Eindhoven (NL); Eliav Itzhak Haskal, Eindhoven (NL); Oscar Johannes Antoinetta Buijk, Eindhoven (NL); Herbert Lifka, Eindhoven (NL); Paulus Cornelis Duineveld, Eindhoven (NL)

(73) Assignee: Koninklijke Philips Electronics N. V., Eindhoven (NL)

( * ) Notice: Subject to any disclaimer, the term of this patent is extended or adjusted under 35 U.S.C. 154(b) by 11 days.

(21) Appl. No.: 10/497,871

(22) PCT Filed: Nov. 20, 2002

(86) PCT No.: PCT/IB02/04875

§ 371 (c)(1),
(2), (4) Date: Jun. 7, 2004

(87) PCT Pub. No.: WO03/050893

PCT Pub. Date: Jun. 19, 2003

(65) Prior Publication Data

US 2005/0017631 A1    Jan. 27, 2005

(30) Foreign Application Priority Data

Dec. 10, 2001    (EP) .................................. 01204744

(51) Int. Cl.
*H01J 1/62*    (2006.01)

(52) U.S. Cl. ........................ 313/507; 313/506; 313/509; 428/917; 428/690

(58) Field of Classification Search ................ 313/507, 313/506, 509; 428/917, 690; 315/169.3, 315/169.2
See application file for complete search history.

(56) References Cited

U.S. PATENT DOCUMENTS

| | | | |
|---|---|---|---|
| 5,661,344 A | 8/1997 | Havemann et al. | |
| 6,222,315 B1 * | 4/2001 | Yoshizawa et al. | 313/509 |
| 6,249,084 B1 | 6/2001 | Yamana | |
| 6,628,069 B2 * | 9/2003 | Chung et al. | 313/506 |
| 6,699,728 B2 * | 3/2004 | Guenther et al. | 438/39 |
| 2002/0043928 A1 * | 4/2002 | Cho | 313/505 |
| 2004/0096771 A1 * | 5/2004 | Kashiwagi et al. | 430/192 |

FOREIGN PATENT DOCUMENTS

| | | |
|---|---|---|
| GB | 2347017 | 8/2000 |
| WO | WO0141229 | 6/2001 |

* cited by examiner

*Primary Examiner*—Tuyet Thi Vo

(57) ABSTRACT

The invention relates to a device, such as an electroluminescent display device, comprising a substrate, first electrodes which are arranged over the substrate, second electrodes which are arranged over the first electrodes and at least one electrically insulating structure which separates two of the second electrodes and is arranged over at least one of the first electrodes. The insulating structure comprises an opening which extends from the top surface of the structure to the first electrode beneath the structure. The invention further relates to a method of manufacturing such a device. In one preferred embodiment, this method involves the use of sacrificial structures with which openings are obtained the upper parts of which extend along the entire length of the respective insulating structures.

20 Claims, 4 Drawing Sheets

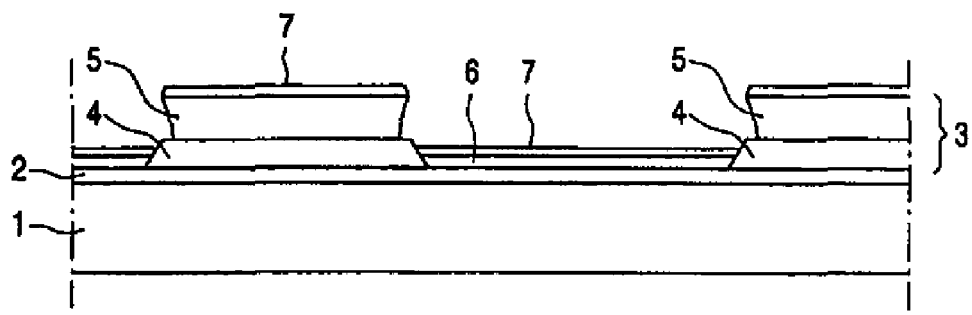
Fig.1 [Prior Art]
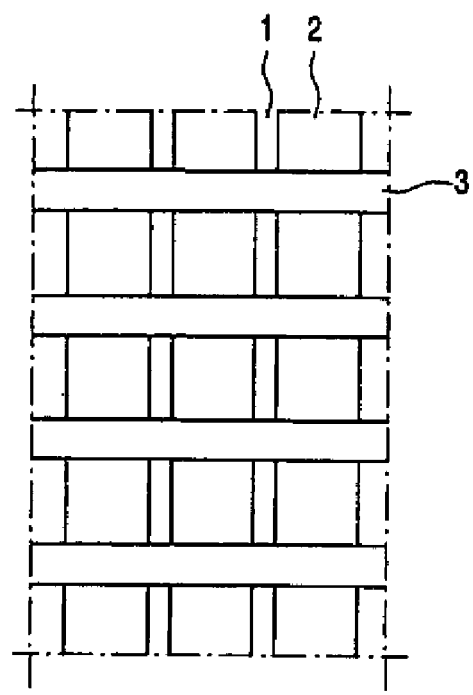
Fig.2 [Prior Art]

DISPLAY DEVICE WITH OPENINGS IN AN INSULATING STRUCTURE

CROSS-REFERENCE TO RELATED APPLICATIONS

This application claims priority to International Application No. PCT/IB02/04875 published in Nov. 20, 2002, which claims the benefit of priority to European Patent Office (EPO) 01204744.5, which was filed in Dec. 10, 2001.

BACKGROUND OF THE INVENTION

The invention relates to a device, such as an electroluminescent (EL) display device, comprising a substrate, first electrodes which are arranged over the substrate, second electrodes which are arranged over the first electrodes, and at least one electrically insulating structure which is arranged over at least one of the first electrodes and separates two of the second electrodes. The invention further relates to a method of manufacturing such a device.

OBJECTS AND SUMMARY OF THE INVENTION

Electroluminescent display devices of the kind mentioned above are known in the art. An example of such a device is shown in FIGS. 1 and 2, which show respectively a cross-section of an EL device and a top plan view of a semi-finished EL device prior to the deposition of the second electrodes. This particular device comprises a transparent substrate 1 made of glass on which relatively broad parallel strips, in this case anodes 2, of an electrically conductive transparent material, such as indium tin oxide (ITO) have been deposited, e.g. by means of physical vapor deposition (PVD). Substantially parallel strips 3 of an electrically insulating material have been arranged over the anodes 2 at an angle of 90 degrees. These insulating structures 3 comprise e.g. a lower insulating base or foot 4 and an upper ridge 5.

Strips 6 of an EL material are deposited between the insulating structures 3, e.g. by means of inkjet printing or vacuum evaporation. The EL strips 6 may comprise two or more sublayers, e.g. a lower hole transporting layer, an emission layer, and an upper electron transporting layer. A cathode layer 7 has been deposited over the EL strips 6 and the insulating structures 4,5. Due to the presence of these structures 4,5, the cathodes 7 can be formed without the use of a mask, in other words they are self-aligning.

A device according to the first paragraph and similar to the device shown in FIGS. 1 and 2 is disclosed in e.g. UK patent application GB 2347017. FIG. 1 of this publication shows a sectional side view of an organic EL device including a substrate provided with anodes spaced apart at predetermined intervals in a stripe-like manner. In order to attain patterning and mutual insulation of the cathodes, the anodes are provided with a plurality of ribs, pairs of which 'are juxtaposed . . . so as to be spaced from each other at a predetermined interval'.

Electrically connecting the anodes and cathodes of the devices described above to e.g. a common connector or a controller requires a lot of space and hence results in a loss of active area and/or necessitates a device of substantial dimensions.

It is an object of the present invention to enable a more compact design of the devices in hand.

To this end, the invention is characterized in that the insulating structure comprises an opening, which extends from the top surface of the structure to the first electrode beneath the structure. It is preferred that an electrically conductive material is arranged in the insulating structure and/or over its top surface and contacts the first electrode beneath the structure.

As will be explained in more detail below, the device according to the present invention, amongst other things, enables uncomplicated routing of leads connecting the first and second electrodes to a connector or controller located on one side of the device.

The invention further relates to a method of manufacturing a device, such as an EL display device, which method is characterized by the insulating structure being provided with an opening which extends from the top surface of the electrically insulating structure to the first electrode beneath the structure. It is preferred that the electrically conductive material is deposited over the intermediate layer and the electrically insulating structure, thus forming a layer which contacts the first electrode beneath the structure.

Apart from relatively minor adjustments to the design of the device and of the layout of the masks used in the production of the device, the production process itself, i.e. nature and order of the individual process steps, need not be fundamentally different from existing processes.

Electrical contact between the said electrically conductive material and the first electrode is enhanced if at least part of the wall of the opening builds a positive angle, i.e. an angle in excess of 90 degrees, with the upper surface of the substrate or an imaginary plane parallel to the upper surface of the substrate.

By using a negative photoresist as the electrically insulating material, it appeared possible to obtain an insulating structure with negatively angled outer walls and positively angled walls inner walls, i.e. the walls of the said opening, by means of a single mask.

BRIEF DESCRIPTION OF THE DRAWINGS

The invention will now be explained with reference to the drawings in which several embodiments of the present invention are schematically shown.

FIG. 1 shows a partial cross-section of an EL device in accordance with the prior art.

FIG. 2 is a schematic top plan view of a semi-finished EL device according to FIG. 1.

DESCRIPTION OF THE PREFERRED EMBODIMENTS

The parts of different display devices which are identical or perform the same or substantially the same function bear the same numerals. FIGS. 1 and 2 have been discussed above.

Figure 3:
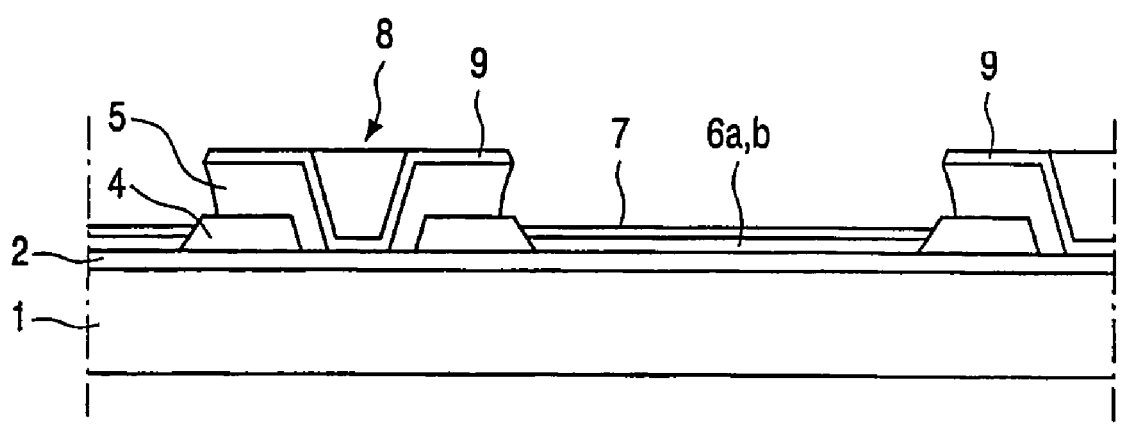
FIG. 3 shows a partial cross-section of an EL device in accordance with the present invention.

FIG. 3 shows a partial cross-section of a display device in accordance with the present invention comprising a glass substrate 1 having a thickness e.g. in the range from 0.3 to 0.7 mm. A pattern of substantially parallel strip-like anodes 2 was arranged on the substrate 1 by means of a customary photolithographic process, for instance by depositing a film of a transparent conductive material, such as indium tin oxide (ITO) having a thickness in the range from e.g. 100 to 300 nm and subjecting it to a generally known edging process involving a photoresist pattern.

Subsequently, a layer of an electrically insulating polymer, such as a positive photoresist, was spin-coated on the assembly of the substrate 1 and the anodes 2. A pattern of isolation strips 4 was defined in this layer by means of a patterned mask, which covered those parts of the polymer layer that were to be maintained, while the uncovered parts were exposed to UV-radiation, and the layer was developed. In accordance with the invention, each of the isolation strips 4 was provided, preferably by means of the same mask, with an opening through which the anode 2 was exposed.

Figure 4:
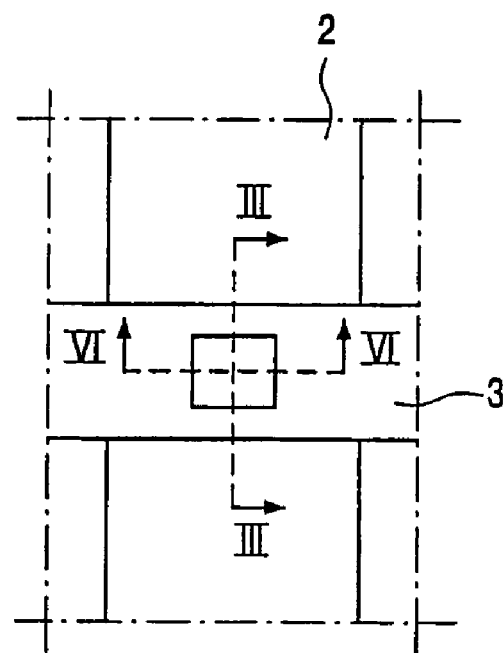
FIG. 4 is a top plan view of a detail of a semi-finished EL device according to FIG. 3.

The process for forming the isolation strips 4 was repeated with a negative photoresist. To this end, a layer of a negative photoresist was deposited on the structure obtained so far and a further patterned mask was placed on this spincoated layer. This mask was used to expose structures in the negative photoresist comprising holes wholly of partly aligned with the openings in the isolation strips 4. In this manner, ridges 5 were obtained, the walls on either side of which built a negative angle with the substrate 1, whereas the walls of the openings 8 thus created (FIG. 4) built a positive angle with a plane parallel to the said substrate 1 and the anode(s) 2.

Between the isolation strips 4 of this particular embodiment, a hole transporting layer (HTL) 6a with a thickness in the range from 50 tot 5000 Å and an emission layer 6b having a thickness of 5 to 5000 Å were deposited. Such deposition can be carried out e.g. by means of vacuum deposition (if the display is a so-called Organic LED display) or inkjet printing (if the display is a Polymer LED display). Modern printing techniques provide precise control over the areas where the material is deposited and where the assembly remains uncovered. Deposition of material in the openings thus can be easily avoided.

Next, a cathode layer was deposited over the entire structure, resulting in self-aligned parallel cathodes 7 between the ridges 5 and leads 9 on top of the ridges 5. Owing to the negative angle of the side walls of the ridges 5, the leads 9 were electrically isolated from the cathodes 7. In contrast, the positive angle of the walls of the openings 8 resulted in a secure electrical connection between the leads 9 and the anodes 2.

In the cross-bar configuration thus obtained, the leads 9 ran parallel to the cathodes 7 and terminated at the same side where the said cathodes 7 terminated. As a result, no complicated and space-consuming routing of leads, from the side(s) where the anodes terminated to the side where the cathodes 7 terminated, was required and both the cathodes 7 and anodes 2 could be connected to a controller by means of a single and relatively small (narrow) connector and flexfoil located on one side of the device.

In general, it is noted that each lead 9 may comprise a single opening 8, in which case the lead 9 is associated with a single, specific anode 2, or each lead 9 may comprise a plurality of openings 8, in which case a single lead 9 can be used to drive a group of anodes 2. If the ridges 5 are sufficiently broad, it is also possible to remove e.g. a middle section of one or more leads 9, thus effectively forming two (or more) parallel leads 9 which can be connected to a corresponding number of anodes through a corresponding number of, optionally staggered, openings 8.

FIGS. 5A–5F show several suitable shapes of negative and positive masks for forming openings 8 with which the electrical connection between the leads 9 and the anodes 2 can be further enhanced. If a negative photoresist is used, the shapes represent an opening in the mask. If a positive photoresist is being used, the shapes represent a masksection.

Figure 5A:
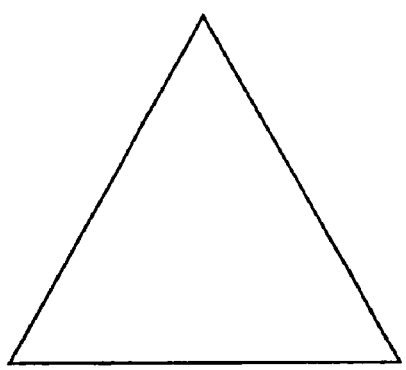
FIGS. 5A–5F show six suitable shapes for the opening shown in FIG. 4.
Figure 5B:
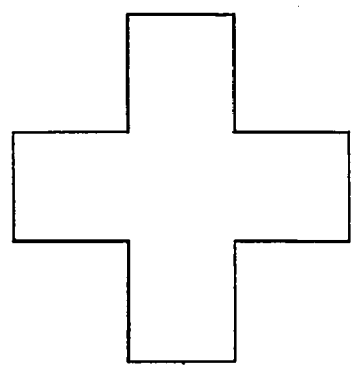
Figure 5C:
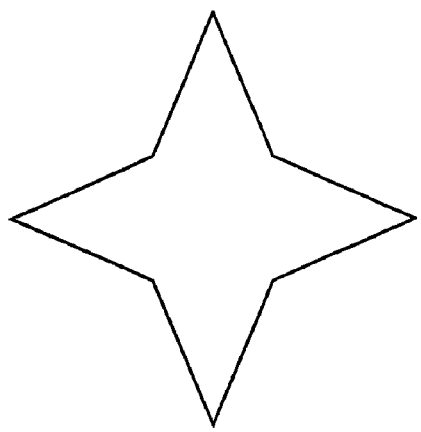
Figure 5D:
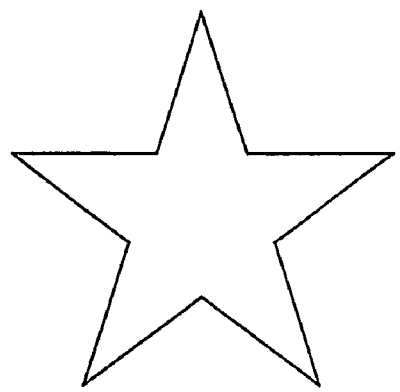
Figure 5E:
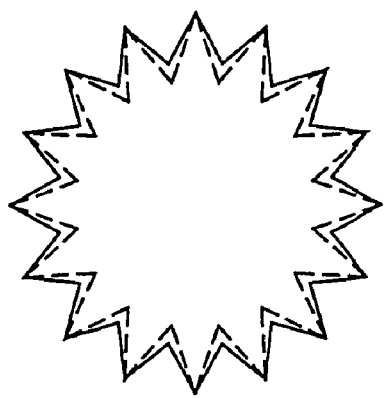
Figure 5F:
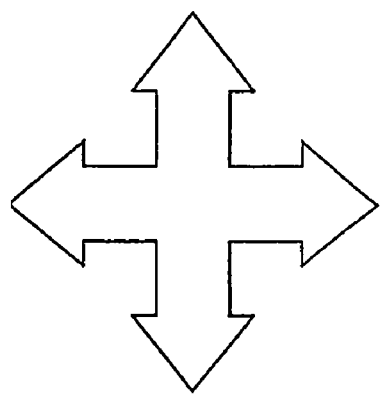

In the case of a negative photoresist, the shape according to FIG. 5A comprises three angles of 60 degrees, whereas the shape according to FIG. 5B comprises four angles of 270 degrees, which are effectively 90 degrees, and eight angles of 90 degrees. Acute angles, i.e. angles of 90 degrees or less, appeared to result in walls having a positive slope. This effect is probably due to interference and/or diffraction effects during exposure of the photoresist, which in turn probably lead to local underexposure. Accordingly, it is preferred that the mask for forming the openings 8 comprises a plurality of angles of 90 degrees or less or 270 degrees or more.

FIGS. 5C to 5F show other examples of suitable shapes, i.e. stars comprising respectively four, five, and thirty-two acute angles, and an alternative to the cross according to FIG. 5B comprising twenty-four acute angles instead of twelve.

Figure 6:
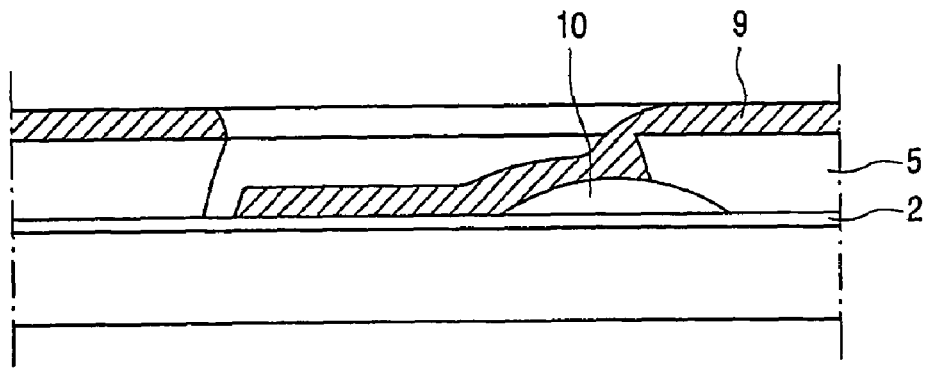
FIG. 6 shows a partial cross-section of a further elaboration of the EL-device according to FIG. 3.
Figure 7A:
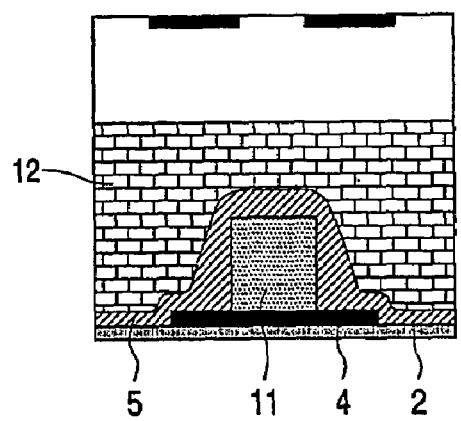
FIGS. 7A–7D show four steps of the manufacture of a second device in accordance with the present invention.
Figure 7B:
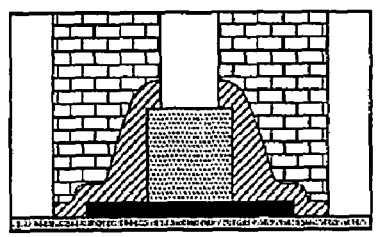
Figure 7C:
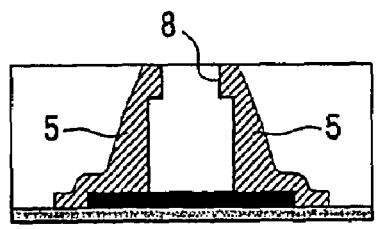
Figure 7D:
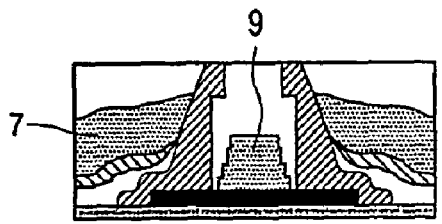

Electrical contact between the leads 9 and the anodes 2 can be further enhanced by providing a structure, such as a small droplet 10 of a positive photoresist, on the anode 2. As can be seen in FIG. 6, which shows a cross-section along line VI—VI in FIG. 4, such a droplet 10 reduces the height of the step between the top surface of the insulating structure 5 and the anode 2 and thus further improves electrical contact between the lead 9 and this anode 2. The said droplet 10 also causes changes in the reflection of light during exposure of the photoresist which is to be used to form the insulating structure S. These changes can be employed to influence the shape and slope of the walls of the insulating structure 5 in such a way as to further facilitate bridging the said step.

FIG. 7 shows four steps in the manufacture of a further embodiment of the present invention, where the upper part of the openings 8 and, hence, the leads 9 extend along the entire length of ridges 5.

Stripes 4 of an isolating material, such as silicon oxide having a thickness of e.g. 100 nm, are deposited on a substrate provided with strip-like anodes 2. The stripes 4 each comprise a hole or opening (not shown) to enable electrical contact between an anode 2 and a lead 9 which is to be deposited later on.

A sacrificial structure 11 of a photoresist is subsequently deposited on the stripes 4 and covered by a layer 5 of a second isolating material, e.g. a layer of silicon nitride having a thickness of e.g. 200 nm, and a thick layer 12 of a photoresist. This layer 12 is developed and, along with layer 5, partially removed by means of e.g. plasma etching so as to expose the sacrificial structure 11 and (part of) the anodes 2. After that, the thick layer 12 of photoresist and the sacrificial structure 11 are removed completely, e.g. by respectively stripping and etching, thereby forming ridges 5 each comprising an opening or, rather, channel 8. A hole-transporting layer, an emission layer, and an electron-transporting layer are subsequently deposited between the ridges 5 by means of vapor deposition or inkjet printing, and a cathode layer is deposited over the entire structure. This cathode layer inherently forms cathodes 7 and leads 9, which leads 9 each contact a specific anode 2 (through the said corresponding holes or openings in the isolating stripes 4) and run and terminate parallel to the cathodes 7.

The invention is not restricted to the above described embodiments which can be varied in a number of ways within the scope of the claims. For instance, apart from electro-luminescent display devices, the invention can be used in e.g. microelectro-mechanical devices or in scanning electron microscopy.

The invention claimed is:

1. A device comprising:
    a substrate,
    a plurality of first electrodes that are arranged over the substrate,
    a plurality of second electrodes that are arranged over the first electrodes, and
    at least one electrically insulating structure that is arranged over at least one electrode of the plurality of first electrodes and between two electrodes of the plurality of the second electrodes,
    wherein the insulating structures comprises an opening that extends from the top surface of the structure to the first electrode beneath the structure.

2. The device of claim 1, wherein
    an electrically conductive material is arranged in and/or over the insulating structure and contacts the first electrode beneath the structure.

3. The device of claim 1, wherein
    at least a part of the wall of the opening builds a positive angle with a plane that is substantially parallel to the upper surface of the substrate.

4. The device of claim 1, wherein:
    the first electrodes include a plurality of substantially parallel first electrodes,
    the second electrodes include a plurality of substantially parallel second electrodes at an angle with the first electrodes,
    the at least one insulating structure includes a plurality of elongated substantially parallel electrically insulating structures separating the second electrodes, and
    the device includes an electroluminescent layer arranged between the first and second electrodes.

5. The device of claim 4, wherein
    electrically conductive material forms electrical leads on top of at least some of the insulating structures, and wherein at least some of these leads are electrically connected to a single first electrode.

6. A method comprising:
    arranging a plurality of first electrodes over a substrate,
    arranging at least one electrically insulating structure over the first electrodes,
    arranging an intermediate layer over the first electrodes and beside the electrically insulating structure, and
    arranging conductive material within an opening of the electrically insulating structure that extends from an upper surface of the electrically insulating structure to an electrode of the plurality of the first electrodes.

7. The method of claim 6, including
    depositing an electrically conductive material over the electrically insulating structure, thus forming a layer that contacts the first electrode beneath the structure.

8. The method of claim 6, wherein
    at least part of the opening is obtained by means of a sacrificial structure.

9. The method of claim 6, wherein
    at least a part of the wall of the opening builds a positive angle with a plane that is substantially parallel to the upper surface of the substrate.

10. The method of claim 9, wherein;
    the electrically insulating structure comprises a photoresist, and
    the insulating structure and the opening are formed by means of a mask that includes a plurality of acute angles where the opening is to be formed.

11. The method of claim 10, wherein
    the photoresist is a negative photoresist.

12. A display device comprising:
    a plurality of first electrodes arranged on a substrate,
    a plurality of insulation structures arranged above the first electrodes, and
    a plurality of second electrodes arranged between the insulation structures;
    wherein
    the insulation structures include openings that facilitate access to the first electrodes between the second electrodes.

13. The display device of claim 12, including
    an electroluminescent layer disposed between the insulation structures.

14. The display device of claim 12, including
    a plurality of conductive reads that are coupled to the first electrodes via the openings in the insulation structure.

15. The display device of claim 12, wherein
    at least a part of a wall of the openings builds a positive angle with a plane that is substantially parallel to the upper surface of the substrate.

16. The display device of claim 12, including
    an electroluminescent layer disposed between the first and second electrodes.

17. The display device of claim 12, wherein
    the plurality of first electrodes includes a parallel arrangement of elongated electrodes.

18. The display device of claim 17, wherein
    the plurality of insulation structures includes a parallel arrangement of elongated structures that are substantially orthogonal to the first electrodes.

19. The display device of claim 17, wherein
    the openings in the insulation structures are arranged in a staggered pattern along the elongated structures.

20. The display device of claim 19, including
    a plurality of conductive leads that are coupled to the first electrodes via the openings in the insulation structure.

* * * * *